US010019981B1

(12) United States Patent
Porter et al.

(10) Patent No.: US 10,019,981 B1
(45) **Date of Patent: *Jul. 10, 2018**

(54) ACTIVE REVERBERATION AUGMENTATION

(71) Applicant: Apple Inc., Cupertino, CA (US)

(72) Inventors: Simon K. Porter, San Jose, CA (US); Sylvain J. Choisel, Palo Alto, CA (US); John C. Stewart, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/612,907

(22) Filed: Jun. 2, 2017

(51) Int. Cl.

| | |
|---|---|
| ***H03G 3/00*** | (2006.01) |
| ***G10K 15/12*** | (2006.01) |
| ***H04R 3/12*** | (2006.01) |
| ***H04R 29/00*** | (2006.01) |

(52) U.S. Cl.
CPC ............... *G10K 15/12* (2013.01); *H04R 3/12* (2013.01); *H04R 29/002* (2013.01)

(58) Field of Classification Search
CPC ........ G10K 15/12; H04R 3/12; H04R 29/002; H04R 2201/40; H04R 2201/403; H04R 1/40; H04R 1/403; H04R 2430/20; H04R 2430/23; H04R 29/00; H04R 2430/21
USPC ... 381/17, 20, 23, 63, 66, 97, 102, 111, 306, 381/307, 310; 700/94
See application file for complete search history.

(56) References Cited

U.S. PATENT DOCUMENTS

| | | | | |
|---|---|---|---|---|
| 7,606,380 | B2 | 10/2009 | Melanson | |
| 8,345,887 | B1 | 1/2013 | Betbeder | |
| 9,219,972 | B2 | 12/2015 | Vilermo et al. | |
| 2002/0106090 | A1 | 8/2002 | Dahl et al. | |
| 2008/0004729 | A1 * | 1/2008 | Hiipakka ................. | H04R 5/04 700/94 |
| 2009/0060236 | A1 * | 3/2009 | Johnston .................. | H04R 3/12 381/304 |
| 2009/0304198 | A1 | 12/2009 | Herre et al. | |

(Continued)

OTHER PUBLICATIONS

Boueri, Maurice, et al., "Audio Signal Decorrelation Based on a Critical Band Approach", *Audio Engineering Society Convention Paler 6291*, (Oct. 2004), 6 pages.

(Continued)

*Primary Examiner* — Vivian Chin
*Assistant Examiner* — Friedrich W Fahnert

(57) ABSTRACT

A method for using a loudspeaker array that is housed in a loudspeaker cabinet to present audio content to a listener in a room includes receiving (1) an audio channel that includes audio content and (2) acoustical characteristics of the room. The method also produces (1) a first beamformer input signal from the audio channel and (2) a second beamformer input signal and a third beamformer input signal by decorrelating the audio channel and adjusting the audio channel in accordance with the acoustical characteristics of the room. The second and third beamformer input signals are different de-correlated versions of the audio channel. The method also generates driver signals from the first, second, and third beamformer input signals to drive the loudspeaker array to produce a main beam, a first ambient beam, and a second ambient beam, respectively. Other embodiments are also described and claimed.

22 Claims, 7 Drawing Sheets

(56) References Cited

U.S. PATENT DOCUMENTS

| | | | | |
|---|---|---|---|---|
| 2010/0040243 | A1 | 2/2010 | Johnston | |
| 2014/0064527 | A1 | 3/2014 | Walther et al. | |
| 2014/0211945 | A1 | 7/2014 | Norimatsu et al. | |
| 2015/0380000 | A1 | 12/2015 | Melkote et al. | |
| 2016/0088388 | A1* | 3/2016 | Franck | H04R 27/00<br>381/305 |
| 2016/0094929 | A1 | 3/2016 | Brannmark et al. | |

OTHER PUBLICATIONS

Potard, Guillaume, et al., "Decorrelation Techniques for the Rendering of Apparent Sound Source Width in 3D Audio Displays", *Proc. of the 7th Int. Conference on Digital Audio Effects* (*DAFx'04*), (Oct. 5-8, 2004), 280-284.

* cited by examiner

ACTIVE REVERBERATION AUGMENTATION

FIELD

An embodiment of the invention relates to an audio system that enhances the listening experience, for example in a sparsely furnished room, by adding electronically de-correlated audio content to its sound output. Other embodiments are also described.

BACKGROUND

It is understood by acoustic professionals that sparsely furnished rooms do not sound as good as furnished rooms. For example, sparsely furnished rooms with sound-reflecting surfaces (e.g., walls and ceilings) that are clear of furnishings (e.g., shelves, furniture, carpet, and drapes) have low a quality reverberation characteristic due to the strength and spacing of reflections. With such low quality reverberation characteristics, listeners within the room can experience an unpleasant echoing effect. However, once furnishings are added into the room, the reverberation quality is improved, thereby improving the listening experience. For instance, adding some functional storage, display cabinets, and bookcases can drop the reverberation time whilst improving reverberation quality, because of the diffusive nature of the furnishings. Therefore, one effect of adding a few furnishings is reducing the reverberation time and increasing reverberation quality, thereby allowing a listener to create a pleasing listening space.

SUMMARY

A sparsely furnished room may adversely affect the quality (e.g., density of) of early reflections and late reflections (reverberation) within the room. As sparsely furnished rooms are less diffusive by nature, there are fewer (and stronger) early and late reflections experienced by the listener. As a result, the sound is less uniform (caused by gaps between the early and late reflections), creating an undesirable user experience. When furniture is added into the room, however, more reflections are created, filling the gaps, thereby improving perceived sound quality. To exemplify this point, FIG. 1 shows the effect on the early and late reflections by adding furniture to a sparsely furnished room. Specifically, FIG. 1 shows downward views of two differently furnished rooms and corresponding impulse responses. Specifically, this figure shows downward views of a sparsely furnished room 105*a*, and of a furnished room 110*a*. A loudspeaker cabinet 115 is operating in the room to produce a stimulus sound, e.g., an impulse or a suitable stimulus such as a sine sweep, that can be used to measure an impulse response. Also shown are corresponding impulse responses (105*b* and 110*b*) of each room. In one embodiment, the impulse responses are schematic representations of the stimulus sound and several sound reflections (e.g., early and late), which are each an attenuated identical copy of the stimulus sound with respect to a distance traveled by the sound reflection. The impulse response shows a direct sound portion 101 (e.g., sound that first arrives at the listener's ears), early reflections 102, and late reflections 103 that are perceived by the listener 120. There are fewer peaks in the early reflections 102 interval and the late reflections 103 interval, because the sparsely furnished room 105*a* has fewer surfaces that are obstructive and diffusive. Therefore, the gaps between the peaks of the early and late reflections create an undesirable comb filter effect that is experienced by the listener 120.

The furnished room 110*a* is acoustically more desirable. The furnished room 110*a* in this example is the same as the sparsely furnished room 105*a*, but with additional objects 125. These objects can include any type of obstruction, along with any additional listeners. Additional reflections 104 are created in the room because of the obstructive and diffusive nature of the objects 125. As a result, diffusion of the early reflections 102 and late reflections 103 here are improved (e.g., the early reflections 102 and late reflections 103 contain more peaks, or the early reflections interval and the late reflections interval are more densely packed with peaks than in the sparsely furnished room 105*a*), thereby creating more uniformity in the sound energy experienced by the listener 120 and therefore a more pleasurable sound experience.

An embodiment of the invention is an audio system that adds additional early and late reflections in a sparsely furnished room by adding de-correlated audio content into the room. With the addition of early and late reflections, the system increases the quality and uniformity of early and late reflections (e.g., reverberation), resulting in a sparsely furnished room that is at least acoustically desirable as a furnished room, but without the additional objects.

One embodiment of the invention is a method that renders the audio content of an input audio channel, by producing a main beam and several ambient beams where the ambient beams are de-correlated versions of the input audio channel, using a loudspeaker array that is housed in a loudspeaker cabinet in a room. The method may be performed by a digital signal processor, which receives (1) the input audio channel that includes audio content that is to be converted into sound by the loudspeaker array housed in the loudspeaker cabinet and (2) acoustical characteristics of the room. The method produces a first beamformer input signal from the audio channel. The method also decorrelates the audio channel and adjusts the audio channel in accordance with the acoustical characteristics of the room, to produce second and third beamformer input signals that are each different de-correlated versions of the audio channel. The method generates driver signals from the first, second, and third beamformer input signals to drive the electro-acoustic transducers (speakers) of the loudspeaker array to produce a main beam, a first ambient beam, and a second ambient beam, respectively.

In one embodiment, the produced beams are based on differently processed audio content. For instance, in this embodiment, the first and second ambient beams are based on audio content taken from the audio channel that has been decorrelated, and the main beam is based on the audio channel without decorrelation.

In one embodiment, inverting an audio channel, as opposed to decorrelation, produces one or more of the beamformer input signals. For instance, to produce the second beamformer input signal, the method adjusts the audio channel in according with the acoustical characteristics of the room. To produce the third beamformer input signal, the method may invert the second beamformer input signal, e.g. multiplies it by negative one or performs a polarity inversion. Several techniques for doing so are described.

In another embodiment, the loudspeaker array produces the sound beams at different angles with respect to the listener. For instance, the loudspeaker array is to produce a main beam that is pointed in the direction of the listener and to produce the ambient beams in separate directions away from the listener. By emitting sound in different directions, sound can be spread throughout the whole room, thereby making the room's sound energy more uniform and immersive at the listener.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one. Also, in the interest of conciseness and reducing the total number of figures, a given figure may be used to illustrate the features of more than one embodiment of the invention, and not all elements in the figure may be required for a given embodiment.

DETAILED DESCRIPTION

Several embodiments of the invention with reference to the appended drawings are now explained. Whenever the shapes, relative positions and other aspects of the parts described in the embodiments are not explicitly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

Figure 2:
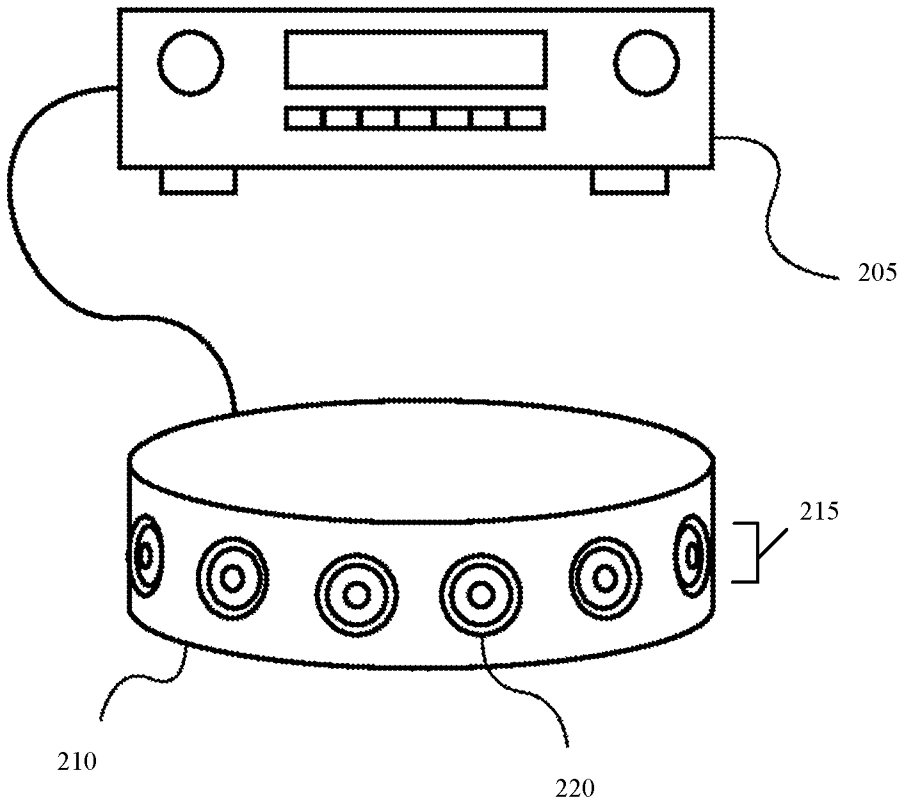
FIG. 2 shows an audio receiver and a cylindrical loudspeaker cabinet that includes a loudspeaker array.

FIG. 2 shows an audio receiver 205 and a generally cylindrical shaped loudspeaker cabinet 210 that includes a loudspeaker array 215. The audio receiver 205 may be coupled to the cylindrical loudspeaker cabinet 210 to drive individual drivers 220 in the loudspeaker array 215 to emit various sound beams into a listening area. Although shown to be coupled by a wire, the receiver 205 may also communicate with the loudspeaker cabinet 210 through wireless means. In other embodiments, functions performed by the audio receiver (e.g., digital signal processing by an audio rendering processor) may be performed by circuit components within the loudspeaker cabinet 210, thereby combining a portion or all of the electronic hardware components of the receiver 205 and loudspeaker cabinet 210 into one enclosure. In one embodiment, the audio receiver 205 and the loudspeaker cabinet 210 may be part of a home audio system or an audio system in a vehicle.

The drivers 220 in the loudspeaker array 215 may be arranged in various ways. As shown in FIG. 2, the drivers 220 are arranged side by side and circumferentially around a center vertical axis of the cabinet 210. Other arrangements for the drivers 220 are possible. The drivers 220 may be electrodynamic drivers, and may include some that are specially designed for sound output at different frequency bands including any suitable combination of tweeters and midrange drivers, for example. In addition, the cabinet 210 may have other general shapes, such as a generally spherical or ellipsoid shape in which the drivers 220 may be distributed evenly around essentially the entire surface of the sphere. In one embodiment, the cabinet may be part of a multi-function consumer electronics device (e.g., a smartphone, a tablet computer, a laptop, and a desktop computer).

Figure 3:
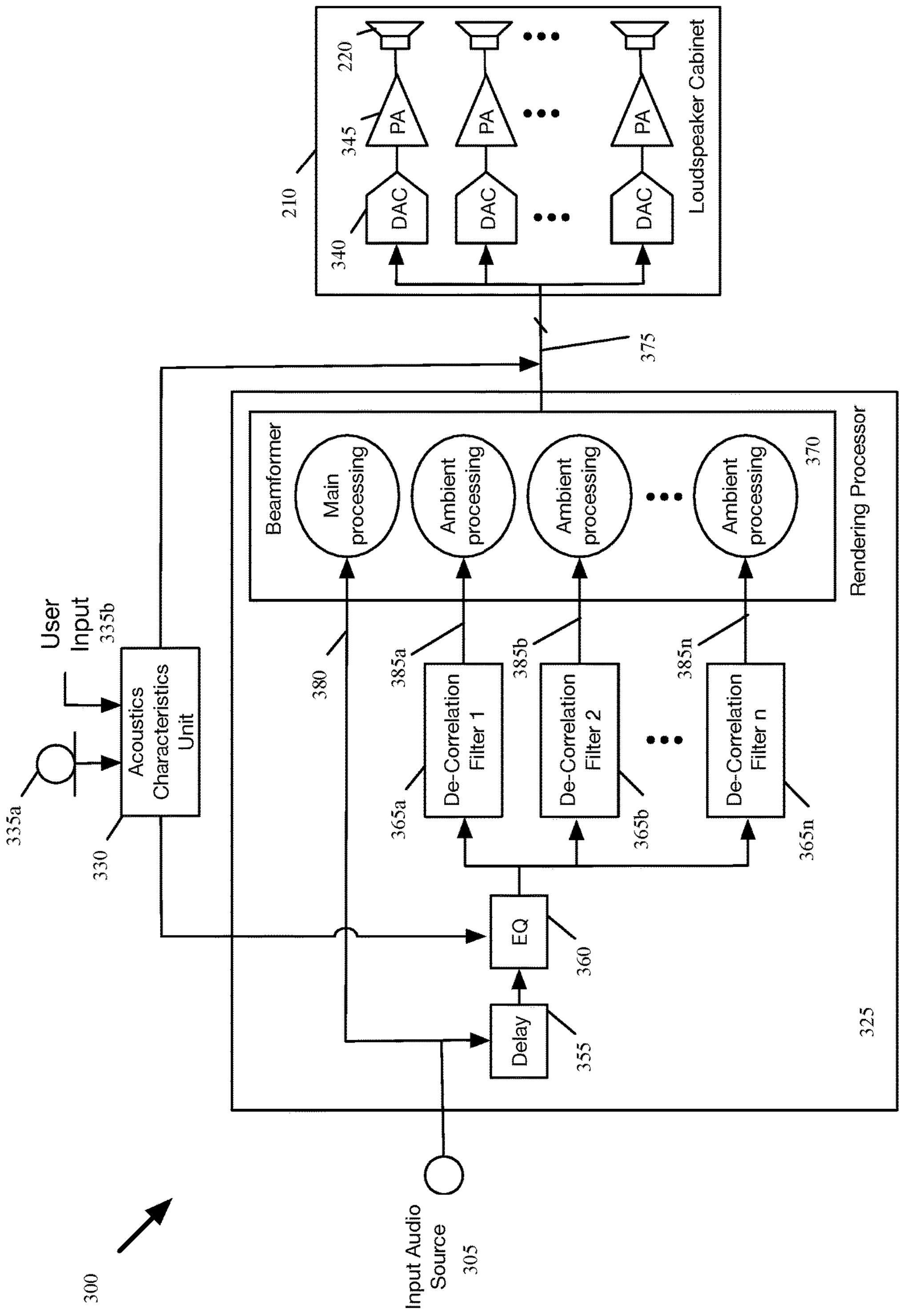
FIG. 3 shows a block diagram of an audio system having a beamforming loudspeaker array according to one embodiment of the invention.

FIG. 3 shows a block diagram of an audio system 300 having a beamforming loudspeaker array that is being used for playback of a piece of sound program content (e.g., a musical work, or a movie soundtrack.) The audio system 300 includes the loudspeaker cabinet 210, a rendering processor 325, an acoustics characteristics unit 330, and an input audio source 305. The loudspeaker cabinet 210 in this example includes therein a number of power audio amplifiers 345 each of which has an output coupled to the drive signal input of a respective loudspeaker driver 220. Each amplifier 345 receives an analog input from a respective digital to analog converter (DAC) 340, where the latter receives its input digital audio signal through an audio communications link 375. Although the DAC 340 and the amplifier 345 are shown as separate blocks, in one embodiment the electronic circuit components for these may be combined, not just for each driver but also for multiple drivers, in order to provide for a more efficient digital to analog conversion and amplification operation of the individual driver signals, e.g., using for example class D amplifier technologies.

The individual digital audio drive signal for each of the drivers 220 is delivered through the audio communication link 375, from a rendering processor 325. The rendering processor 325 may be implemented within a separate enclosure from the loudspeaker cabinet 210 (for example, as part of the receiver 205 of FIG. 2). However, the rendering processor 325 can also be implemented through other devices e.g., smartphone, tablet computer, laptop computer, or desktop computer. In these instances, the audio communication link 375 is more likely to be a wireless digital communications link, such as a BLUETOOTH link or a wireless local area network link. In other instances however, the audio communication link 375 may be over a physical cable, such as a digital optical audio cable (e.g., a TOSLINK connection), or a high-definition multi-media interface (HDMI) cable. In still other embodiments, the rendering processor 325 may be implemented within the loudspeaker cabinet 210, as described above. In this case, the audio communication link 375 would be a wired connection such as any combination of on-chip and chip-to-chip digital or electro-optical interconnects.

The acoustics characteristics unit 330 is to obtain or measure the acoustical characteristics of the room. The acoustical characteristics of the room may include the reverberation time of the room and its corresponding change with frequency, room impulse response, and other properties such as size (dimensions) of the room and locations of the listener and any walls or windows relative to the loudspeaker cabinet. Reverberation time may be defined as the time in seconds for the average sound in a room to decrease by 60 decibels after a source stops generating sound. The reverberation spectrum can be defined as the spectrum of the late energy. It may be calculated as the frequency response of the room impulse response with the direct sound removed. Reverberation time and spectrum are affected by the size of the room and the amount of reflective or absorptive surfaces within the room. A room with highly absorptive surfaces will absorb the sound and stop it from reflecting back into the room. This would yield a room with a short reverberation time and low reverberation level. Reflective surfaces will reflect sound and will increase the reverberation time within a room. In general, larger rooms have longer reverberation times than smaller rooms. Therefore, a larger room will typically require more absorption to achieve the same reverberation time as a smaller room.

The acoustics characteristics unit may be implemented as a programmed processor that has access to a microphone 335*a* and the loudspeaker array 215 to measure reverberation time or room impulse response, and it may also include user interface hardware and software, e.g., a touch screen and associated user interface software to receive information about the room "manually" from a user. In one embodiment, the acoustics characteristics unit 130 generates an audio signal that is output, through the audio communications link 375, as sound into the room by the loudspeaker array 215. The microphone 335*a* coupled to the acoustics characteristics unit 330 senses the sounds produced by the loudspeaker array 215 as they reflect and reverberate through the room. The microphone 335*a* feeds the sensed sounds to the acoustics characteristics unit 330 for processing, e.g. to compute a reverberation time or a room impulse response.

In one embodiment, the acoustics characteristics unit 330 uses the reverberation time and/or the room impulse response to determine whether the loudspeaker cabinet 210 is in a sparsely furnished room. Once it is determined that the loudspeaker cabinet 210 is in the sparsely furnished room, the acoustics characteristics unit 330 makes that information available to the rendering processor 325, which uses the information to process and output a main beam and various ambient beams through the loudspeaker drivers 220 of the loudspeaker array 215, as described below. However, in another embodiment, when the loudspeaker cabinet 210 is determined to be in a furnished room, the rendering processor uses this information to process and output only the main beam, as the ambient beams are unnecessary because of the diffusive effect of the furnishings in the furnished room.

As described above, the acoustics unit 330 analyzes the sensed sounds from the microphone 335*a* and may calculate the reverberation time and level of the room and/or the impulse response of the room. In other embodiments, instead of (or in conjunction with) using a microphone 335*a* to sense sounds, the acoustics characteristics unit 330 can receive a user input 335*b* specifying (1) the reverberation time of the room and/or (2) room dimensions and other properties of the room (e.g., material) for the acoustics characteristics unit 330 to calculate the reverberation time of the room. With the reverberation time calculated, the acoustics characteristics unit 330 makes the acoustical characteristics of the room, in the form of electronic data, available to the equalizer 360 for processing. The equalizer 360 processing is described below.

Still referring to FIG. 3, the rendering processor 325 is to receive a single input audio channel of a piece of sound program content from an input audio source 305. The input audio source 305 may provide a digital input or an analog input. The input audio source may include a programmed processor that is running a media player application program and may include a decoder that is producing the digital audio input to the rendering processor. To do so, the decoder may be capable of decoding an encoded audio signal, which has been encoded using any suitable audio codec, e.g., Advanced Audio Coding (AAC), MPEG Audio Layer II, MPEG Audio Layer III, and Free Lossless Audio Codec (FLAC). Alternatively, the input audio source may include a codec that is converting an analog or optical audio signal, from a line input, for example, into digital form for the rendering processor.

In one embodiment, the rendering processor 325 can receive two or more input audio channels of the piece of sound program content. For example, the rendering processor 325 may receive left and right input audio channels that may represent a musical work that has been recorded as two channels. Alternatively, there may be more than two input audio channels, such as for example the entire audio soundtrack in 5.1-surround format of a motion picture film or movie intended for public theater or home theater surround sound settings. These are to be converted into sound by the drivers 220, after the rending processor transforms these input channels into the individual input drive signals to the drivers 220. The rendering processor 325 may be implemented as a programed digital microprocessor entirely (a processor and memory having stored therein instructions to be executed by the processor), or equivalently as a combination of a programed processor and dedicated hardware digital circuits such as digital filter blocks and state machines.

Figure 1:
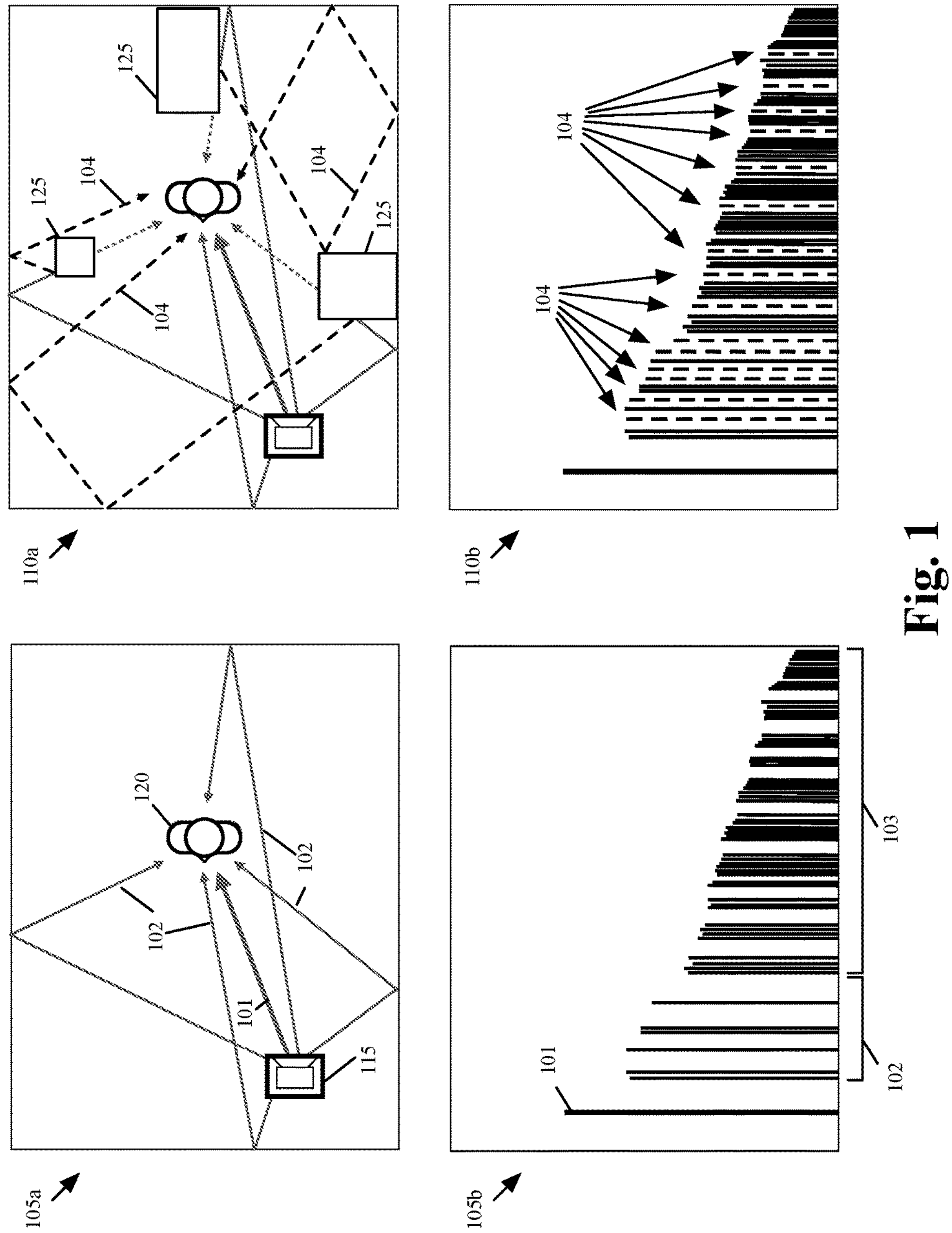
FIG. 1 shows downward views of two differently furnished rooms and corresponding graphical representations of impulse responses in each room.

In one embodiment, the rendering processor 325 includes a delay block 355, an equalizer 360, de-correlation filters 365, and a beamformer 370. The beamformer 370 is configured to produce individual drive signals for the drivers 220 so as to "render" the audio content of the input audio channel as multiple, simultaneous, desired beams emitted by the drivers 220 as a beamforming loudspeaker array. Specifically, the drive signals output by the beamformer 370 cause the loudspeaker drivers 220 of the array to produce a main beam and several ambient beams of sound. The main beam includes audio content that is to be aimed at (or towards) a listener (as shown in FIG. 1 above). The ambient beams, on the other hand, include ambient sound content that is aimed away from the listener. More about the directional aspects of the main and ambient beams is further described in FIGS. 5-6, below.

In the illustrated embodiment, the input audio channel is processed (e.g., delayed and/or equalized) prior to being received by the beamformer 370. Alternatively however, the beamformer 370 may receive the input audio channel directly from the input audio source 305 through path 380, without passing through the delay block 355 and the equalizer 360 which are shown in this case as being in-line at the input to the beamformer 370. The delay block 355 is to receive and delay the input audio channel by a certain amount of time (e.g., 5 milliseconds). The delay block 355 delays the audio channel in order for the ambient beams produced by the loudspeaker array to be correctly timed with respect to the main beam (e.g., in order for the ambient beams to be emitted after the main beam). In one embodiment, a designer defines the delay time. While in another embodiment, the delay time is to be set by the listener.

The equalizer 360 is to adjust a balance between frequency components within the audio channel in order to achieve a certain reverberation level in the room. It may do so based on acoustical characteristics (e.g., reverberation time) of the room, which as described above may be provided by the acoustics characteristics unit 330. By adjusting the frequency spectrum of the audio channel in accordance with the reverberation time, the equalizer 360 defines how much ambient sound should be added into the room. For instance, if the reverberation time is long, this is indicative of a room with more reflections and therefore less absorptive. In contrast, if the reverberation time is short, this indicates that the room is highly absorptive. If the reverb time is short, the equalizer 360 is configured to boost the low frequencies (that will be produced as ambient sound beams) in order to achieve a desirable reverberation level within the room. The converse is also true. For example, if the acoustics characteristics unit 330 determines that a current low frequency level within the room is high (e.g., based on a measured room impulse response), then it may configure the equalizer 360 to boost the high frequencies (of the ambient sound) to achieve a flat reverberation spectrum.

The de-correlation filters 365*a*, 365*b*, . . . , 365*n* are each to receive the audio channel from the equalizer 360 but then de-correlate the audio channel differently, to produce beamformer input signals each of which corresponds to a particular ambient beam that the loudspeaker array 215 emits. There may be one or more ambient beams produced contemporaneously, from one or more beamformer input signals, respectively, that are produced by respective de-correlation filters 365*a*, 365*b*, . . . , 365*n*. For the sake of brevity, when discussing the de-correlation filters 365*a*, 365*b*, . . . , 365*n*, reference will only be made to 365*a* and 365*b* for the case of two ambient beams, however it is understood that any and all of the de-correlation filters may be capable of performing the following operations. Specifically, the de-correlation filters 365*a* and 365*b*, each produce a beamformer input signal that passes through paths 385*a* and 385*b*, respectively, to the beamformer 370. The beamformer 370 uses the beamformer input signal 380 to process audio content directly from audio source 305, while the beamformer inputs signals 385*a-n* contain de-correlated audio content therein, all which are processed into transducer or driver signals that drive the loudspeaker array 215 so as to emit a main beam that corresponds to the audio content in the input audio channel, and one or more ambient beams that correspond to the de-correlated (or ambient) audio content as produced by the de-correlation filters 365*a* and 365*b*. The loudspeaker array 215 emits ambient beams that are different de-correlated versions of the input audio channel.

In one embodiment, audio content in each beam emitted by the loudspeaker array 215 is limited to the audio content that is in its corresponding beamformer input signal. For example, the main beam may have audio content primarily from a beamformer input signal received through path 380, while each ambient beam may have de-correlated audio content primarily from a corresponding beamformer input signal received through one of paths 385*a*, 385*b*, . . . , 385*n*. Hence, the audio content within the beamformer input signal received through path 380 does not include de-correlated audio content.

The de-correlation filters 365*a* and 365*b* are to de-correlate the audio channel differently (relative to each other), in order to add random ambient sound into the room. Decorrelation involves adjusting phase of the audio channel at different frequencies. Adjusting the phase of the audio channel ensures that the sound of the ambient beams is not combining constructively or destructively with the sound of the main beam. Otherwise, if the sound of the ambient beams were correlated with the sound of the main beam, then the combined sound would have adverse effects at the listener position. For instance, as the room has set path lengths from the loudspeaker array 215 to the listener position, correlated content will get groupings within their spectral density when sound of the ambient beams is combined with sound of the main beam. The result is undesirable a comb filter effect being heard by the listener, because the constructive/destructive nature of the correlated sound creates a repeating pattern of peaks and dips in the frequency response (as shown in FIG. 1 above). In one embodiment, each de-correlation filter 365*a* and 365*b* de-correlates the audio channel through a pseudo-random process.

In one embodiment, the de-correlation filters 365*a* and 365*b* are each made of a different set of serially connected (cascaded) all-pass filters. Each set of all-pass filters de-correlates the audio channel differently. For example, de-correlation filter 365*a* may produce a de-correlated ambient beam signal by performing different phase shifts at different frequencies. In another example, the two de-correlation filters 365*a*, 365*b* may perform different phase shifts to the same frequencies. By producing different de-correlated ambient beam signals, this ensures that sound from the ambient beams associated with the de-correlated signals are as diffuse as possible, while not constructively and/or destructively interfering with sound from other ambient beams (and sound from the main beam). Filling the room with increased amounts of diffusive de-correlated ambient sound creates a spatial-ness experienced by the listener within the room.

Figure 4:
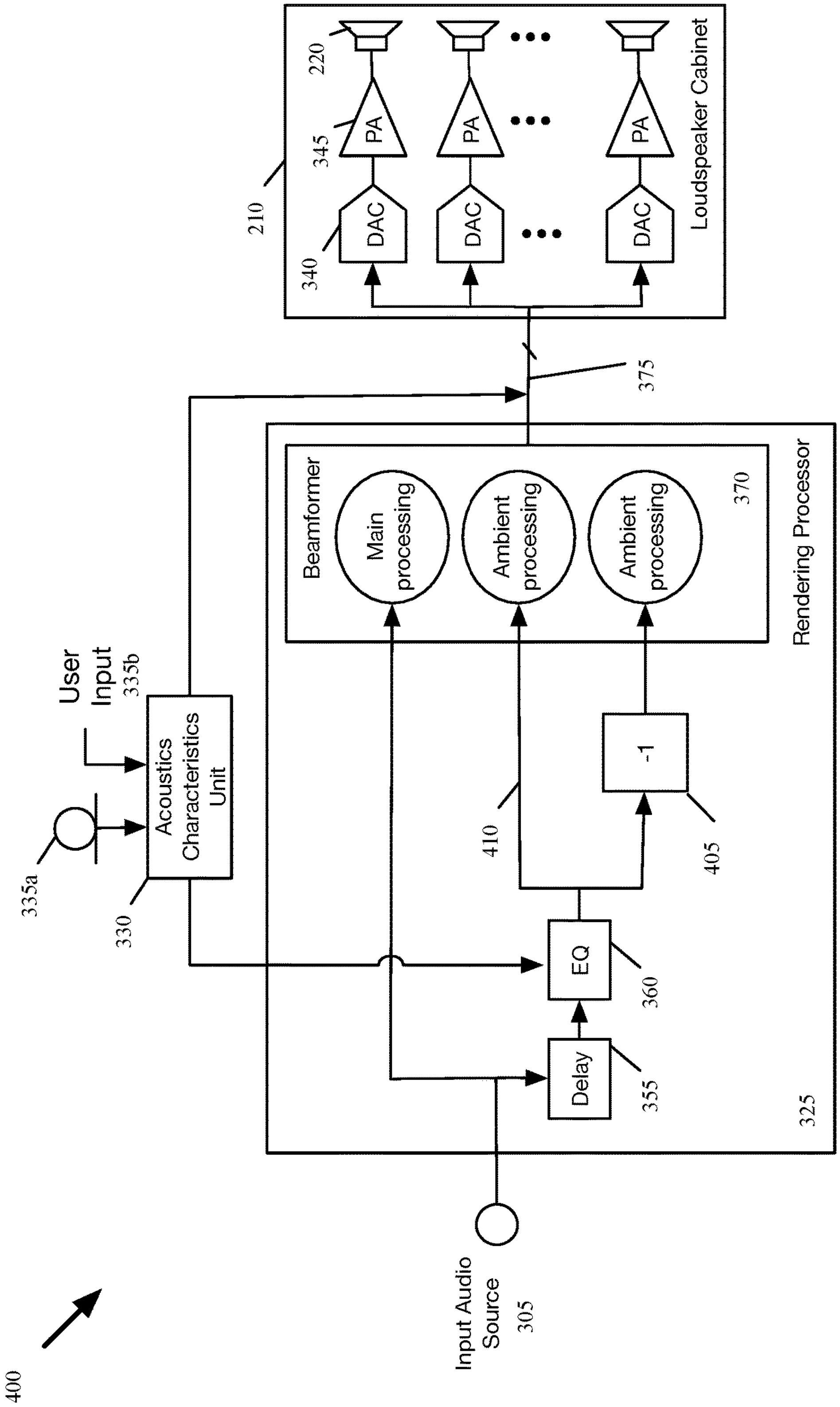
FIG. 4 shows a block diagram of an audio system having a beamforming loudspeaker array according to another embodiment of the invention.

In another embodiment, where there are at least two ambient beams, instead of (or in conjunction with) de-correlating the audio channels, the beamformer input signal associated with one of the ambient beams is simply an inverted version (phase inversion) of another beamformer input; this arrangement is also expected to cause the loudspeaker array 215 to produce random ambient sound. FIG. 4 illustrates such an embodiment. This figure shows a block diagram of an audio system 400 that is similar to the audio system 300 of FIG. 3. However, instead of having de-correlation filters, audio system 400 includes a path 410 and a phase inverter 405 that are parallel to each other in that each receives the same input audio channel (in this example, from the output of the equalizer 360) but feeds a different beamformer input (different ambient beams) of the beamformer 370. For the sake of brevity, only the differing components between the two audio systems will be discussed. The path 410 enables a direct connection between the equalizer 360 and the beamformer 370. The inverter 405 is to receive and invert the audio channel from the equalizer 360. To invert the audio channel in the digital domain, the inverter 405 may simply multiply the audio channel by "−1." The beamformer 370 receives the audio channel (through the path 410) as well as the inverted audio channel, and processes them according to a beamforming algorithm that is configured with desired beam patterns; the algorithm outputs the driver signals that result in the loudspeaker array 215 emitting the two ambient beams having the desired beam patterns. In this way, the two ambient beams are not de-correlated as in FIG. 3, but rather out of phase.

Figure 5:
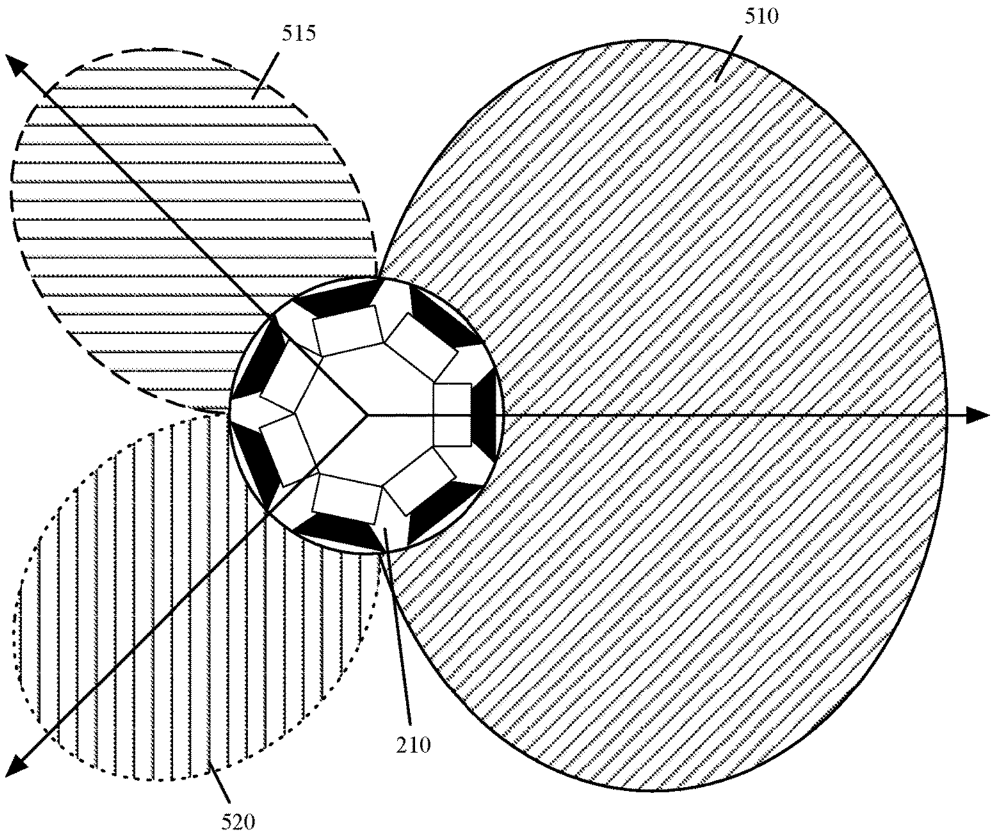
FIG. 5 shows a downward view of example sound beams produced by the audio system according to one embodiment of the invention.

Turning now to FIG. 5, this figure depicts a downward view of sound beams being emitted by the loudspeaker cabinet 210. As described above, the loudspeaker cabinet 210 emits sound as a main beam that has audio content from the input audio source (e.g., without decorrelation or inversion) and several ambient beams that have de-correlated audio content (or two ambient beams that are inverted versions of each other.) Here, the driver signals produced by the beamformer 370 in the rendering processor 325 (see FIG. 3) cause the loudspeaker drivers 220 of the array to produce sound beams having (1) a main beam 515 and (ii) two ambient beams 515 and 520. As described above in FIGS. 3-4, each of the ambient beams may correspond to a beamformer input signal that is (1) an audio channel, (2) a de-correlated ambient beam signal, or (3) an inverted audio channel. As described above, the ambient beams 515 and 520 are emitted to fill the room with additional reflections in order to increase the spectral density of the early reflections and late reflections (reverberation). Furthermore, the ambient beams are emitted in different directions so that the ambient sound can spread throughout the whole room, thereby making the room's sound energy more uniform and immersive at the listener. For example, ambient beam 515 is emitted at a 135 degree angle from the main beam 510 and ambient beam 520 is emitted at a 225 degree angle from the main beam 510. In one embodiment, the angle and width at which the ambient beams are emitted is based on the number of ambient beams produced by the loudspeaker cabinet 210. While in another embodiment, the angle and width are preset by the listener 120 and/or the manufacturer, or they are defined as a function of the acoustical characteristics of the room. The direction (with respect to the loudspeaker cabinet 210) in which the main beam 510 is emitted may be based on the reverberation time and/or room impulse response, described in FIG. 3, above. For instance, the direction of the main beam 510 may be based on the room impulse response measured by the acoustics characteristics unit 330, such that sound initially received by the listener 120 is contained within the main beam.

Figure 6:
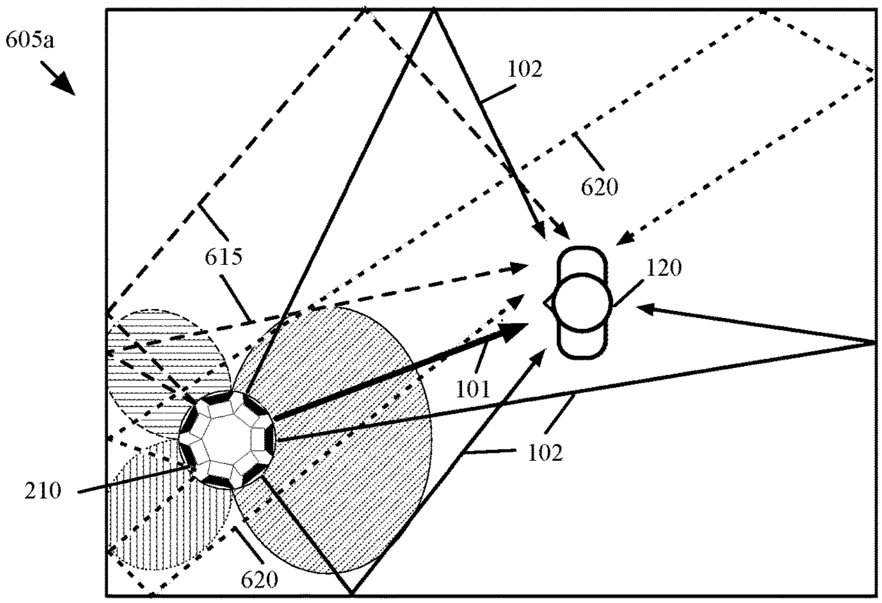
FIG. 6 shows a downward view onto a horizontal plane of a room in which the audio system is operating and a corresponding graphical representation of an impulse response of the room.
Figure 6:
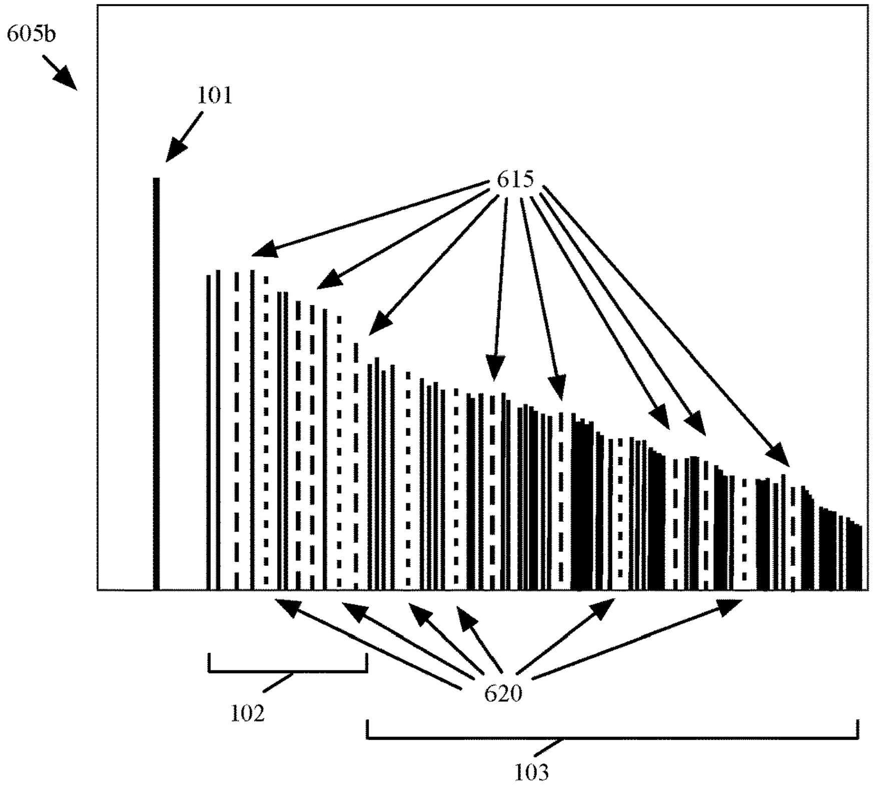

FIG. 6 shows a downward view of a sparsely furnished room 605*a* in which the loudspeaker cabinet 210 is operating and a corresponding impulse response 605*b* of the room. Like the loudspeaker cabinet 115 in FIG. 1, the loudspeaker cabinet 210 is operating in the room to produce a stimulus sound that can be used to measure an impulse response. To produce the stimulus sound, however, unlike the loudspeaker cabinet 115, the loudspeaker cabinet 210 emits sound through the main beam 510 and two ambient beams 515 and 520 contemporaneously, as shown in FIG. 5. The impulse response 605*b* shows the (1) direct sound portion 101 and (2) early reflections 102 and late reflections 103 that both include additional (i) reflections 615 of sound emitted in ambient beam 515 and (ii) reflections 620 of sound emitted in ambient beam 520. The additional reflections 615 and 620 of the sound in the ambient beams 515 and 520, respectively, increase the total amount of reflections in the room, thereby increasing the density of peaks in the room impulse response 605*b*. As the density increases, the undesirable comb filter effect (as shown in the impulse response 105*b* of the sparsely furnished room in FIG. 1) diminishes, thereby making the sound more uniform and pleasant to the listener 120. Therefore, the additional reflections 615 and 620 result in a sparsely furnished room that is at least acoustically desirable as a furnished room, but without requiring the presence of random objects 125 therein with different types of surfaces.

In one embodiment, the ambient beams 515 and 520 may be produced, such that the additional reflections 615 and 620 increase different portions of the (early and late) reflections in the room. For example, as previously described in FIG. 3, the delay block 355 delays the audio channel in order to time the production of the ambient beams. The delay block 355 may also delay the production of the ambient beams, such that the additional reflections 615 and 630 of the ambient beams 515 and 520 are added later into the room. For instance, depending on the time in which the audio channel is delayed, additional reflections 615 and 620 may be added to the late reflections 103, but not to the early reflections 102. In one embodiment, the time delay may result in the additional reflections 615 and 620 being added at any point during either the early reflections 102 or the late reflections 103.

In one embodiment, a loudspeaker (e.g., such as loudspeaker 210) that is capable of producing ambient beams (e.g., 515 and 520) through a loudspeaker array (e.g., 215) gives an extra degree of freedom than traditional speakers that only produce sound in the direction of the listener (e.g., such as through a main beam). For example, with a traditional speaker (e.g., loudspeaker 115 in FIG. 1), the total sound power emitted by the speaker, which is driven by an input audio channel, may be defined as $P(f)=Pd(f)+Pr(f)$, where $Pd(f)$ is the power of the direct sound portion (e.g., 101) and $Pr(f)$ is the power of the reflections (e.g., 102 and 103). Traditionally, in order to achieve a particular sound power, a user would have to adjust the equalization (e.g., balance between frequency components) of the input audio channel that drives the speaker, which may change the quality of sound in the direction of the listener. In contrast, the loudspeaker 210 may adjust the sound power through the use of the ambient beams 515 and 520, while not (or minimally) adjusting sound directed towards the listener (e.g., not adjusting the main beam 510). In this way, the main beam 510 remains "flat" (e.g., the beamformer input signal corresponding to the main beam 510 maintains its original spectral shape that was designed to sound pleasant to the listener 120). To adjust the sound power of the ambient beams, the equalizer 360 may filter the input audio channel with a filter transfer function $Heq(f)$, resulting in a total sound power emitted by the loudspeaker array 210 as $P(f)=Pd(f)+Pr(f)+(Heq^2(f)*Pamb(f))$, where $Pamb(f)$ is the power of the ambient sound produced by the ambient beams 515 and 520. Hence, by filtering the input audio channel with filter $Heq(f)$ to adjust the ambient sound in the ambient beams, the total sound power may be adjusted such that it has a smooth desired shape that is pleasant to the listener, while not adjusting the sound directed towards the listener in the main beam 510.

Figure 7:
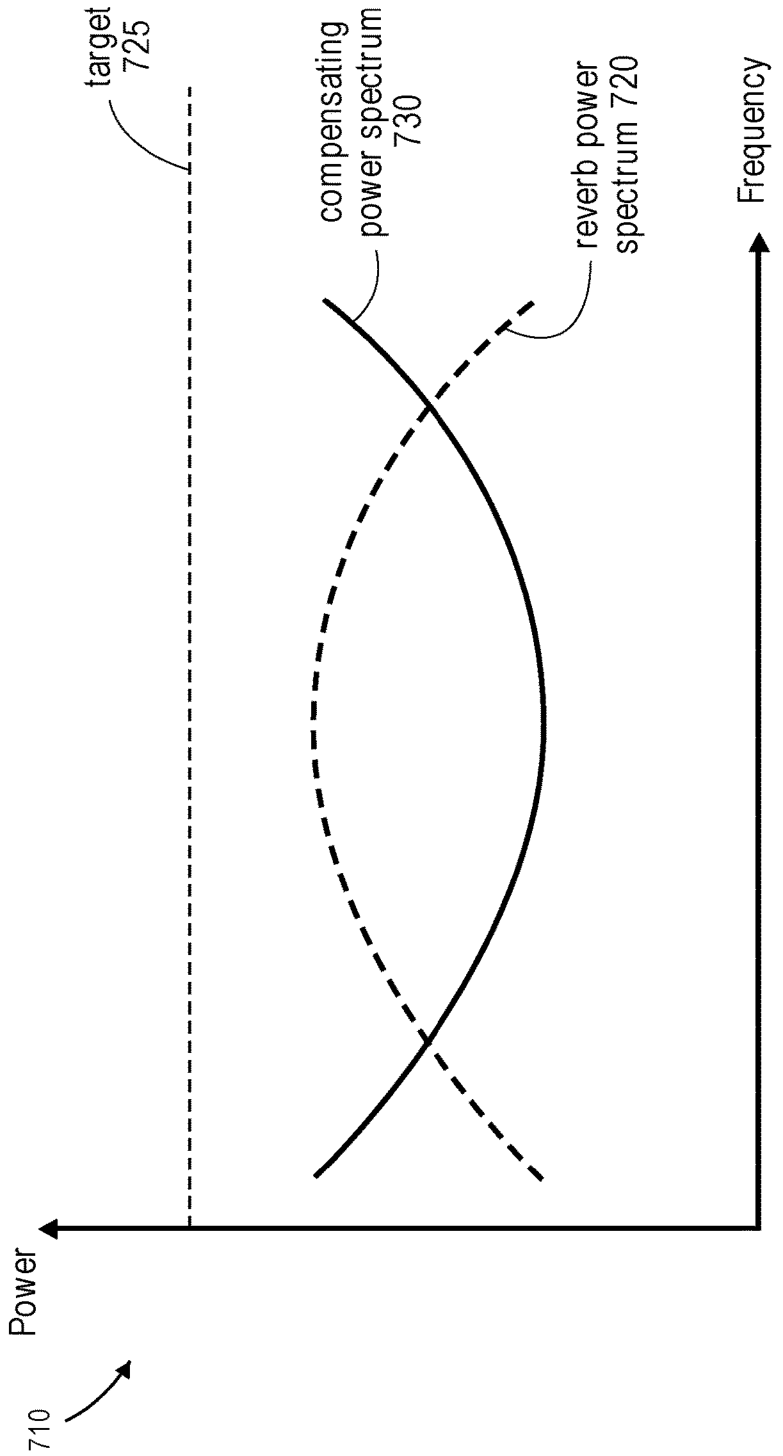
FIG. 7 shows an example of compensating a reverberation power spectrum of the room.

FIG. 7 shows an example of compensating a reverberation power spectrum 720 (e.g., calculated on a late part of the room impulse response, with the direct and early reflections removed) of a room (e.g., the sparsely furnished room 605*a* of FIG. 6). This figure also shows the needed compensating power spectrum 730 (or frequency response) of the decorrelation filter 365, to achieve a target reverberation spectrum 725. The target reverberation spectrum 725 in this example is flat (but could have any shape). In one embodiment, the decorrelation filter 365 can include a suitably configured or programmed series of all-pass filters that effectively add reverberant energy into the resulting beamformer input signal. The ambient beams, which result from beamformer input signals that have been produced in this manner, produce reverberated sound energy, whose spectrum is complementary to that produced by the direct or main beam alone, because reverberant energy is not added to the beamformer input signal 380 that produces the main beam—see FIG. 3. As a result, the total reverberated energy in the room (as produced by the ambient beams acting alone) is represented by the target 725.

As explained above, an embodiment of the invention may be a non-transitory machine-readable medium (such as microelectronic memory) having stored thereon instructions, which program one or more data processing components (generically referred to here as a "processor") to perform the digital audio processing operations described above including delaying, spectral shaping (by the equalizer 360), decorrelating, beamforming, signal strength measurement, filtering, addition, subtraction, inversion, comparisons, and decision making (such as by the acoustics characteristics unit 330). In other embodiments, some of these operations might be performed by specific hardware components that contain hardwired logic (e.g., dedicated digital filter blocks). Those operations might alternatively be performed by any combination of programmed data processing components and fixed hardwired circuit components.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. As many of the operations performed in the rendering processor 325 are linear functions (e.g., delay, equalization, de-correlation, and inversion), such tasks can be performed in any order. For example, in one embodiment, the equalizer 360 can adjust the audio channel before being delayed by the delay block 355. While in another embodiment, the audio channel can be de-correlated by the de-correlation filters 365*a* and 365*b* before being delayed and spectrally shaped, by the delay block 355 and the equalizer 360, respectively. The description is thus to be regarded as illustrative instead of limiting.

What is claimed is:

1. A method for using a loudspeaker array that is housed in a loudspeaker cabinet to present audio content to a listener in a room, the method comprising:
- receiving, by a rendering signal processor, (1) an audio channel that includes audio content that is to be converted into sound by the loudspeaker array housed in the loudspeaker cabinet and (2) acoustical characteristics of the room;
- producing, by the rendering signal processor, a first beamformer input signal from the audio channel;
- decorrelating, by the rendering signal processor, the audio channel, and adjusting the audio channel in accordance with the acoustical characteristics of the room, to produce a decorrelated and adjusted audio channel as a second beamformer input signal;
- decorrelating, by the rendering signal processor, the audio channel, and adjusting the audio channel in accordance with the acoustical characteristics of the room, to produce a further decorrelated and adjusted audio channel as a third beamformer input signal, wherein the second and third beamformer input signals are different de-correlated versions of the audio channel; and
- generating, by the rendering signal processor, driver signals from the first, second, and third beamformer input signals to drive the loudspeaker array to produce a main beam, a first ambient beam, and a second ambient beam, respectively.

2. The method of claim 1, wherein adjusting the audio channel comprises:
- applying a delay to the audio channel; and
- spectrally shaping the audio channel based on the acoustical characteristics.

3. The method of claim 2, wherein the acoustical characteristics of the room comprise one of a reverberation time of the room, a reverberation spectrum of the room, or an impulse response of the room.

4. The method of claim 1, wherein decorrelating the audio channel comprises filtering the audio channel through a first series of allpass filters to produce the first beamformer input signal and filtering the audio signal through a second series of allpass filters to produce the second beamformer input signal.

5. The method of claim 1, wherein decorrelating the audio channel comprises filtering the audio channel through a pseudo-random process to produce one of the first or second beamformer input signals.

6. The method of claim 1, wherein the main beam, the first ambient beam, and the second ambient beam are produced by the loudspeaker array by outputting (1) the main beam in a direction towards the listener and (2) the first and second ambient beams at different directions pointed away from the listener.

7. A method for using a loudspeaker array that is housed in a loudspeaker cabinet to present audio content to a listener in a room, the method comprising:
- receiving, by a rendering signal processor, (1) an audio channel that includes audio content that is to be converted into sound by the loudspeaker array housed in the loudspeaker cabinet and (2) acoustical characteristics of the room;
- producing, by the rendering signal processor, a first beamformer input signal from the audio channel;
- adjusting, by the rendering signal processor, the audio channel in accordance with the acoustical characteristics of the room, to produce a second beamformer input signal;
- inverting, by the rendering signal processor, the second beamformer input signal to produce a third beamformer input signal that is a 180 degrees phase shifted version of the second beamformer input signal; and
- generating, by the rendering signal processor, driver signals from the first, second, and third beamformer input signals to drive the loudspeaker array to produce a main beam, a first ambient beam, and a second ambient beam.

8. The method of claim 7, wherein adjusting the audio channel comprises:
- applying a delay to the audio channel; and
- spectrally shaping the audio channel based on the acoustical characteristics.

9. The method of claim 8, wherein the acoustical characteristics of the room comprise one of a reverberation time of the room or an impulse response of the room.

10. The method of claim 7, wherein the main beam, the first ambient beam, and the second ambient beam are produced by the loudspeaker array by outputting (1) the main beam in a direction towards the listener and (2) the first and second ambient beams at different directions pointed away from the listener.

11. An audio system in a room comprising:

a loudspeaker cabinet, having integrated therein a loudspeaker array having a plurality of loudspeaker drivers, wherein the plurality of loudspeaker drivers are to convert driver signals into sound;

a processor; and memory having stored therein instructions that when executed by the processor receive (1) an audio channel that includes audio content that is to be converted into sound by the plurality of loudspeaker drivers of the loudspeaker array and (2) acoustical characteristics of the room;

produce a first input signal from the audio channel;

decorrelate the audio channel and adjust the audio channel in accordance with the acoustical characteristics of the room, to produce a second input signal;

decorrelate the audio channel and adjust the audio channel in accordance with the acoustic characteristics of the room, to produce a third input signal, wherein the second and third input signals are different de-correlated versions of the audio channel; and generate driver signals to drive the plurality of loudspeaker drivers to produce a main beam, a first ambient beam, and a second ambient beam, wherein the first and second ambient beams are based on de-correlated audio content from the audio channel, and the main beam is based on the audio channel without de-correlation.

12. The system of claim 11, wherein the instructions to adjust the audio channel comprise instructions that when executed by the processor:

apply a delay to the audio channel; and spectrally shape the audio channel based on the acoustical characteristics.

13. The system of claim 12, wherein the acoustical characteristics of the room comprise one of a reverberation time of the room, a reverberation spectrum of the room, or an impulse response of the room.

14. The system of claim 11, wherein the instructions to decorrelate the audio channel comprises instructions that when executed by the processor filter the audio channel through a first series of allpass filters to produce the first input signal and filter the audio channel through a second series of allpass filters to produce the second input signal.

15. The system of claim 11, wherein the instructions to decorrelate comprises instructions that when executed by the processor filter the audio channel through a pseudo-random process to produce at least one of the first or second input signals.

16. The system of claim 11, wherein the main beam, the first ambient beam, and the second ambient beam are produced by the plurality of loudspeaker drivers by outputting (1) the main beam in a direction towards the listener and (2) the first and second ambient beams at different directions pointed away from the listener.

17. An article of manufacture comprising a non-transitory machine-readable medium having instructions stored therein that when executed by a processor receive (1) audio content that is to be converted into sound by a loudspeaker array housed in a loudspeaker cabinet located in a room and (2) acoustical characteristics of the room; produce a first beamformer input signal from the audio content; decorrelate the audio content and adjust the audio content in accordance with the acoustical characteristics of the room, to produce a second beamformer input signal; decorrelate the audio content and adjust the audio content in accordance with the acoustical characteristics of the room, to produce a third beamformer input signal, wherein the second and third beamformer input signals are different de-correlated versions of the audio content; generate driver signals to drive the loudspeaker array to produce a main beam, a first ambient beam, and a second ambient beam, wherein the first and second ambient beams are based on decorrelated audio content from the audio content, and the main beam is based on the audio content without decorrelation.

18. The article of manufacture of claim 17, wherein the instructions that when executed by the processor adjust the audio content comprise:

applying a delay to the audio content; and spectrally shaping the audio content based on the acoustical characteristics, wherein the acoustical characteristics of the room comprise one of a reverberation time of the room, a reverberation spectrum of the room, or an impulse response of the room.

19. The article of manufacture of claim 17, wherein the instructions that when executed by the processor decorrelate the audio content comprise filtering the audio content through a first series of allpass filters to produce the first beamformer input signal and filtering the audio signal through a second series of allpass filters to produce the second beamformer input signal.

20. The article of manufacture of claim 17, wherein the instructions that when executed by the processor decorrelate the audio content comprise filtering the audio content through a pseudo-random process to produce at least one of the first or second beamformer input signals.

21. The article of manufacture of claim 17, wherein each of the second and third beamformer input signals is produced in accordance to a different preset de-correlation process.

22. The article of manufacture of claim 17, wherein the main beam, the first ambient beam, and the second ambient beam are produced by the loudspeaker array by outputting (1) the main beam in a direction towards the listener and (2) the first and second ambient beams at different directions pointed away from the listener.

* * * * *